United States Patent [19]
Kawashimo

[11] Patent Number: 5,207,786
[45] Date of Patent: May 4, 1993

[54] WIRE BONDING METHOD

[75] Inventor: Hiroshi Kawashimo, Itami, Japan

[73] Assignee: Mitsubishi Denki Kabushiki Kaisha, Tokyo, Japan

[21] Appl. No.: 822,678

[22] Filed: Jan. 21, 1992

[30] Foreign Application Priority Data

Feb. 1, 1991 [JP] Japan ................................. 3-31431

[51] Int. Cl.$^5$ ..................... B23K 31/02; H01L 21/603
[52] U.S. Cl. ..................................... 228/179; 328/4.5
[58] Field of Search ................. 228/179, 4.5, 1.1, 110, 228/111, 904

[56] References Cited

U.S. PATENT DOCUMENTS

| | | | |
|---|---|---|---|
| 4,597,522 | 7/1986 | Kobayashi | 228/4.5 |
| 4,789,095 | 12/1988 | Kobayashi | 228/4.5 |
| 5,037,023 | 8/1991 | Akiyama et al. | 228/4.5 |

Primary Examiner—Samuel M. Heinrich
Attorney, Agent, or Firm—Leydig, Voit & Mayer

[57] ABSTRACT

A wire bonding apparatus includes a capillary tip through which a fine metal wire passes, a first clamp disposed above the capillary tip for clamping the fine metal wire, a second clamp disposed above the first clamp for clamping the fine metal wire, a first moving mechanism for moving the capillary tip up and down, and a second moving mechanism for moving the first clamp up and down with respect to the capillary tip in order that an excess length of the fine metal wire which protrudes from the capillary tip may be drawn back into the capillary tip. In a method of using the apparatus, the first clamp clamps the fine metal wire and retracts it through the capillary tip to avoid an excessive wire length between a ball bond and a wire bond in the completed product. The second clamp clamps the wire during the wire bonding process to ensure that excess retracted wire does not again pass through the capillary tip.

2 Claims, 10 Drawing Sheets

WIRE BONDING METHOD

BACKGROUND OF THE INVENTION

1. Field of the Invention

The present invention relates to a wire bonding apparatus and method used in a manufacturing process for semiconductor devices.

2. Description of the Related Art

FIG. 17 shows a conventional wire bonding apparatus. A capillary tip 1 is supported by an ultrasonic horn 2. A first clamper 3 is disposed above the capillary tip 1, and is supported by a first clamper switch 4 which is arranged integrally with the ultrasonic horn 2. The ultrasonic horn 2 and the first clamper switch 4 are coupled to an up/down motion mechanism 5. That is, the capillary tip 1 and the first clamper 3 are moved up and down by the up/down motion mechanism 5 while the relative positions of the above two components are kept constant. A second clamper 6 is supported by a second clamper switch 7 and positioned above the first clamper 3. This second clamper 6 does not move up and down as it is secured at a fixed position. The first and second clampers 3 and 6 clamp a fine metal wire 8 which passes through the capillary tip 1.

A bonding operation will now be explained with reference to FIGS. 18 through 23. First, the capillary tip 1 is used to join a ball 11 formed at the tip of the fine metal wire 8 to a bonding pad of an IC chip 10 on a die pad 9 (FIG. 18). Next, the capillary tip 1 is moved upward (FIG. 19) and over an inner lead 12 while letting out the fine metal wire 8 (FIG. 20). It is then moved downward to join the fine metal wire 8 to the inner lead 12 (FIG. 21). Thereafter, while the first clamper 3 continues to clamp the fine metal wire 8, it is moved upward together with the capillary tip 1, whereby the fine metal wire 8 is cut (FIG. 22). Finally, the tip of the fine metal wire 8 sticking out of the capillary tip 1 is formed into another ball 11 (FIG. 23). This completes one cycle of a bonding process.

The operations performed by the first and second clampers 3 and 6 when the fine metal wire 8 is joined to the inner lead 12, as shown in FIGS. 20 and 21, will be explained below with reference to FIGS. 24 through 29. First, the first clamper switch 4 closes the first clamper 3 which in turn clamps the fine metal wire 8 (FIG. 24). Under this condition, the up/down motion mechanism 5 moves the first clamper 3 as well as the capillary tip 1 downward (FIG. 25). When the capillary tip 1 approaches the inner lead 12, the first clamper 3 is opened (FIG. 26). While the first clamper 3 is opened, the capillary tip 1 and the first clamper 3 are moved a little further downward (FIG. 27). Next, the second clamper switch 7 closes the second clamper 6 which in turn clamps the fine metal wire 8 (FIG. 28). The capillary tip 1 and the first clamper 3 are then moved downward to join the fine metal wire 8 to the inner lead 12 (FIG. 29).

As shown in FIGS. 24 and 25, however, the first clamper 3 clamps the fine metal wire 8 above the inner lead 12. While it continues to clamp the fine metal wire 8, the first clamper 3 and the capillary tip 1 are moved downward. Therefore, as shown in FIG. 28, by the time the capillary tip 1 almost comes in contact with the inner lead 12, the excess fine metal wire 8 has been drawn under the capillary tip 1.

As illustrated in FIGS. 30 and 31, for the above reason, the bottom dead center A of the fine metal wire 8 under the capillary tip 1 is positioned away from the center axis 0 of the capillary tip 1. Therefore, as shown in FIGS. 32 and 33, as the capillary tip 1 is moved downward, the fine metal wire 8 does not come in contact with the inner lead 12 at the bottom dead center A, but instead it comes in contact with the inner lead 12 at a point B which is closer to the capillary tip 1 than the bottom dead center A is. As depicted in FIGS. 34 and 35, when the capillary tip 1 is completely in contact with the inner lead 12, the fine metal wire 8 slips off the inner lead 12 at the point B. As a result, the fine metal wire 8 bends and hangs appreciably. When such a problem occurs, the fine metal wire 8 comes in contact with adjacent wires or inner leads, which may cause a short circuit.

SUMMARY OF THE INVENTION

The present invention has been made to solve such problems. Accordingly, the object of the invention is to provide a wire bonding apparatus and method which can prevent a fine metal wire from bending and hanging.

In order to achieve the above object, according to one aspect of the present invention, there is provided a wire bonding apparatus comprising: a capillary tip through which a fine metal wire passes; a first clamper disposed above the capillary tip for clamping the fine metal wire; a second clamper disposed above the first clamper for clamping the fine metal wire; first moving means for moving the capillary tip up and down; and second moving means for moving the first clamper up and down with respect to the capillary tip in order that an excessive length of fine metal wire which has been drawn through the capillary tip may be drawn back into the capillary tip.

According to another aspect of the invention, there is provided a wiring bonding method by using a capillary tip comprising the steps of: forming a ball at the tip of a fine metal wire which passes through the capillary tip; joining by the capillary tip the ball to a first portion to be bonded; moving the capillary tip from the first portion to be bonded to the vicinity of a second portion to be bonded while the fine metal wire is being drawn; drawing an excessive length of the fine metal wire protruding from of the capillary tip back into the capillary tip; and joining the fine metal wire at the end of the capillary tip to the second portion to be bonded by pressing the capillary tip against the second portion to be bonded.

DESCRIPTION OF THE PREFERRED EMBODIMENT

An embodiment of the present invention will be described below with reference to the accompanying drawings.

Figure 1:
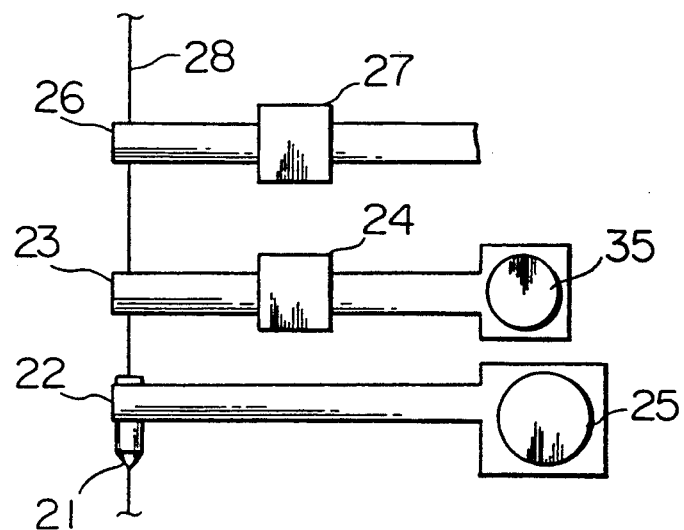
FIG. 1 is a view showing a wire bonding apparatus in accordance with an embodiment of the present invention.

FIG. 1 shows a wire bonding apparatus in accordance with the embodiment of the invention. A capillary tip 21 is supported by an ultrasonic horn 22 which is coupled to a first moving means or mechanism 25 for moving the horn up and down (hereinafter referred to as a horn up/down motion mechanism 25). A first clamper 23 supported by a first clamper switch 24 is disposed above the capillary tip 21. The first clamper switch 24 is coupled to a second moving means or mechanism 35 for moving the first clamper 23 up and down (hereinafter called a first clamper up/down motion mechanism 35). The horn up/down motion mechanism 25 and the first clamper up/down motion mechanism 35 are provided separately. It is thus possible to simultaneously move the first clamper 23 and the capillary tip 21 supported by the ultrasonic horn 22, up and down, while keeping the relative positions of the above two components constant. It is also possible to move the first clamper 23 up and down relative to the capillary tip 21. Also, a second clamper 26 is disposed above the first clamper 23. The second clamper 26 is supported by a second clamper switch 27 which is secured to an unillustrated prop or the like. In other words, the second clamper 26 does not move up and down, but it is instead secured at a fixed position.

The first and second clampers 23 and 26 clamp and release a fine metal wire 28 which passes through the capillary tip 21.

Figure 18:
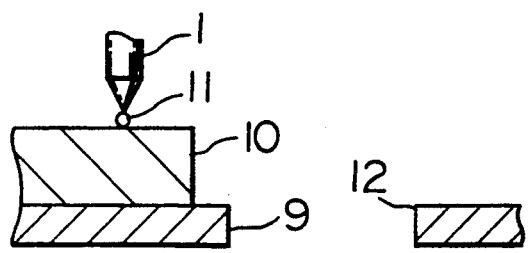
FIGS. 18 through 23 are views each showing a bonding operation by using the bonding apparatus of FIG. 17.
Figure 19:
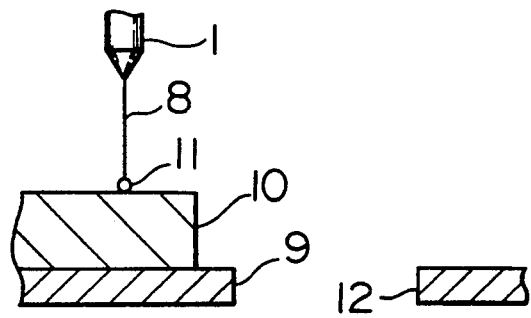
Figure 20:
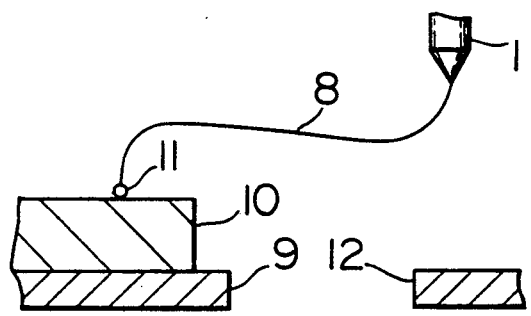
Figure 21:
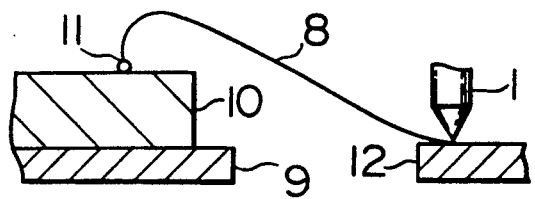
Figure 22:
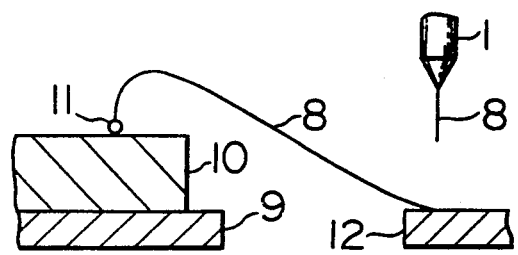
Figure 23:
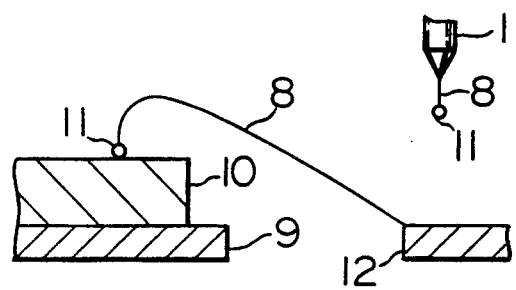
Figure 24:
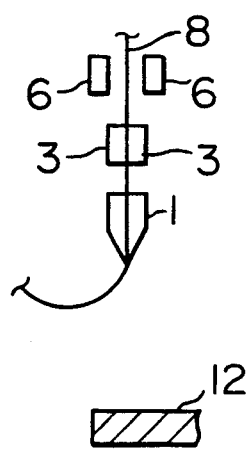
FIGS. 24 through 29 are views each showing, in a bonding process, a clamping operation of the bonding apparatus of FIG. 17.
Figure 25:
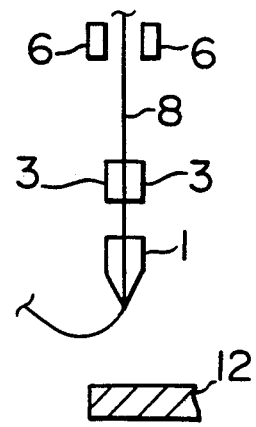
Figure 26:
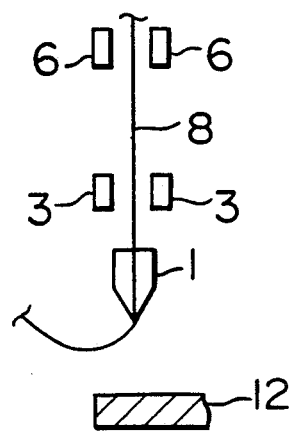
Figure 27:
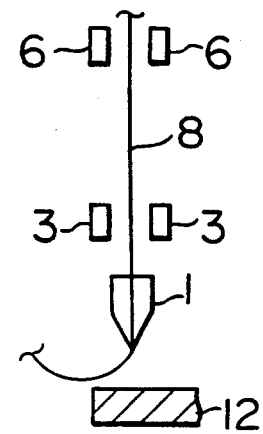
Figure 28:
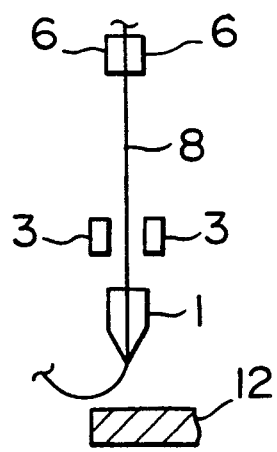
Figure 29:
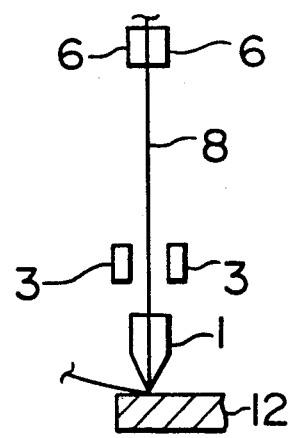
Figure 30:
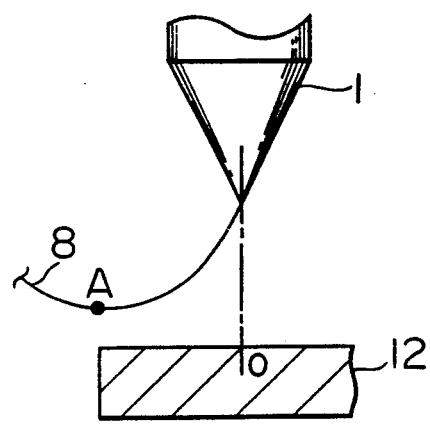
FIGS. 30 through 35 are views each showing states of a fine metal wire when the bonding apparatus of FIG. 17 is in operation.
Figure 31:
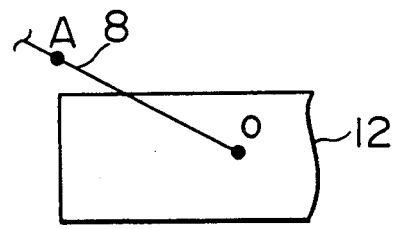
Figure 32:
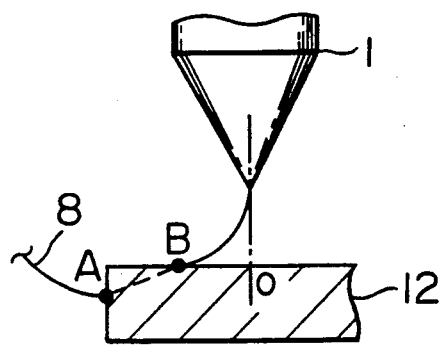
Figure 33:
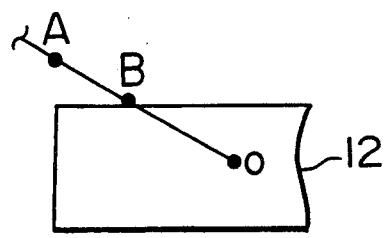
Figure 34:
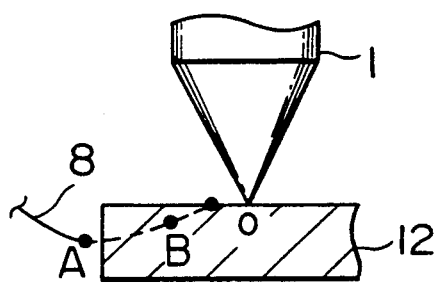
Figure 35:
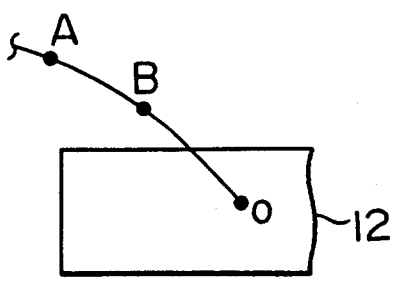

The operation of this embodiment will now be described. In the same manner as in the conventional bonding operation shown in FIGS. 18 through 20, first, a ball formed at the tip of the fine metal wire is joined by the capillary tip 21 to a bonding pad on an IC chip. The capillary tip 21 is then moved upward and over an inner lead 32 while paying out the fine metal wire through the capillary tip 21.

Figure 2:
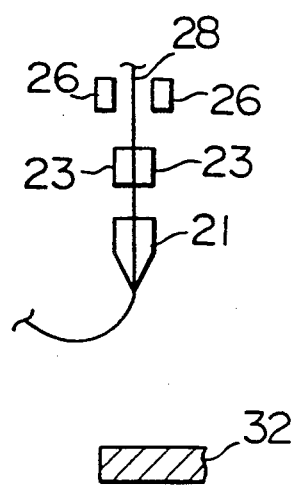
FIGS. 2 through 10 are views each showing, in a bonding process, a clamping operation performed by the bonding apparatus of FIG. 1.
Figure 3:
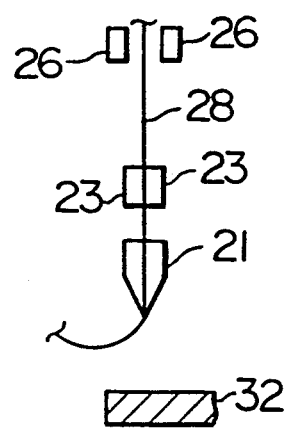
Figure 4:
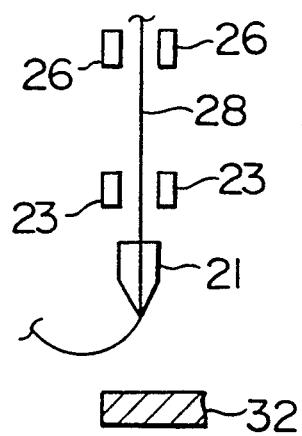
Figure 5:
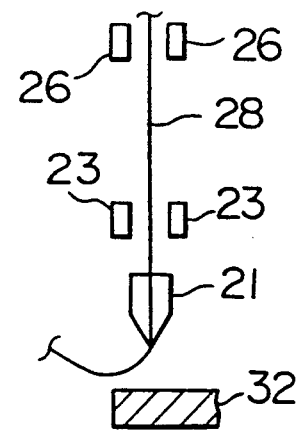

The fine metal wire is thereafter joined to the inner lead 32. The operation of the first and second clampers 23 and 26 at this stage will be explained with reference to FIGS. 2 through 10. First, the first clamper switch 24 closes the first clamper 23 which in turn clamps the fine metal wire 28 (FIG. 2). Under the above conditions, the horn up/down motion mechanism 25 and the first clamper up/down motion mechanism 35, move the capillary tip 21 and the first clamper 23 downward at the same time (FIG. 3). When the capillary tip 21 approaches the inner lead 32, the first clamper 23 is opened (FIG. 4). Under these conditions, the capillary tip 21 and the first clamper 23 are moved further downward until the distal end of the capillary tip 21 comes very close to the inner lead 32 (FIG. 5).

Figure 6:
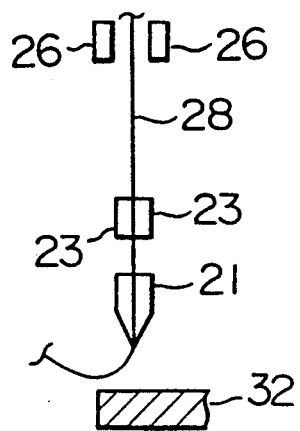
Figure 7:
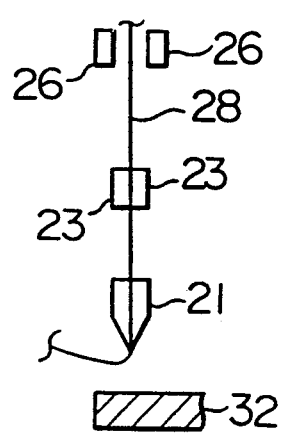
Figure 11:
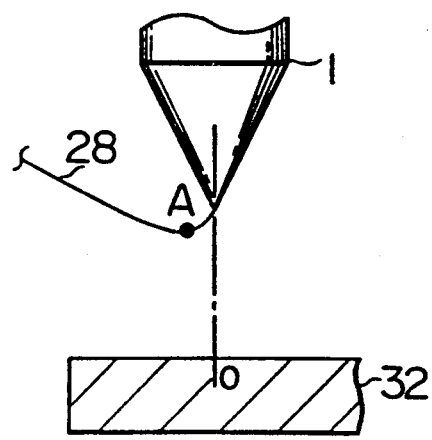
FIGS. 11 through 16 are views each showing states of a fine metal wire when the bonding apparatus of FIG. 1 is in operation.
Figure 12:
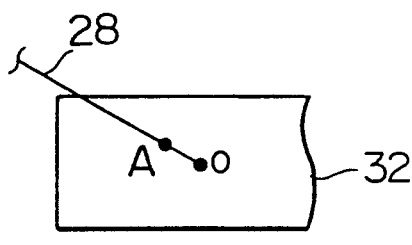

The first clamper switch 24 then closes the first clamper 23 which in turn clamps the fine metal wire 28 (FIG. 6). The first clamper up/down motion mechanism 35 moves only the first clamper 23 upward (FIG. 7). In other words, the first clamper 23 is moved upward relative to the capillary tip 21, whereby the excess fine metal wire 28 which has been drawn through and out of the capillary tip 21 is drawn back into the capillary tip 21. As illustrated in FIGS. 11 and 12, at this time the bottom dead center A of the fine metal wire 28, which has been drawn under the capillary tip 21, comes close to the center axis 0 of the capillary tip 21.

Figure 8:
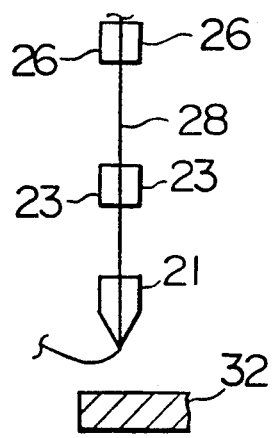
Figure 9:
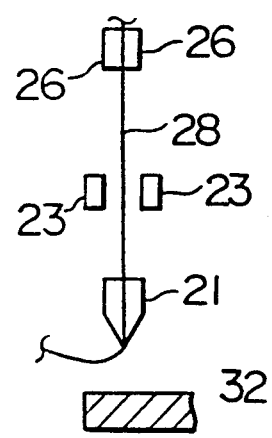
Figure 10:
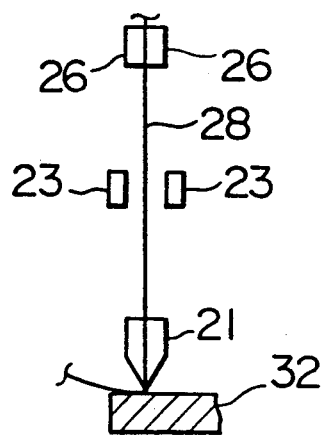
Figure 13:
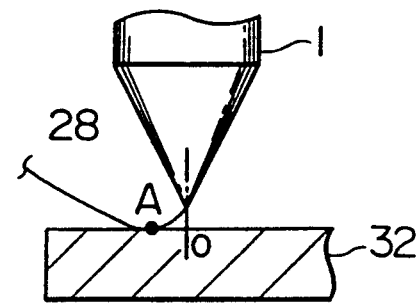
Figure 14:
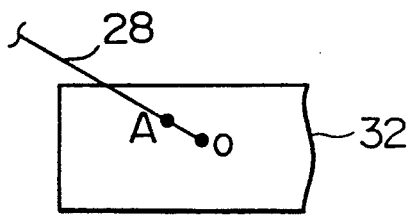
Figure 15:
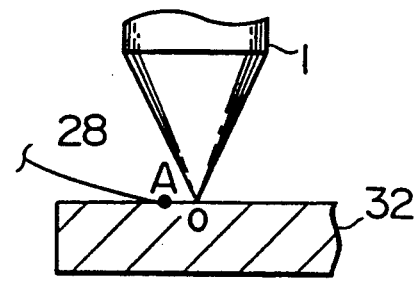
Figure 16:
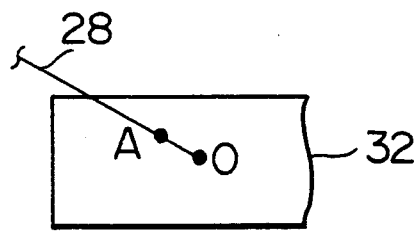
Figure 17:
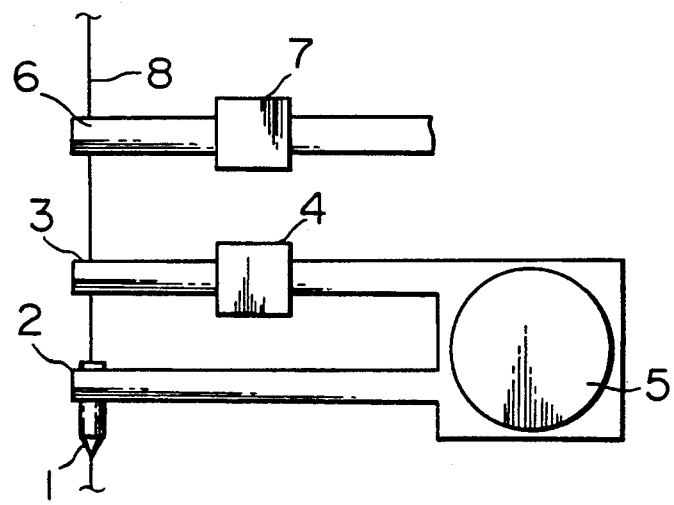
FIG. 17 is a view illustrating the conventional bonding apparatus.

Furthermore, the second clamper switch 27 closes the second clamper 26 which in turn clamps the fine metal wire 28 (FIG. 8). The first clamper switch 24 thereafter opens the first clamper 23 (FIG. 9). Under the above conditions, the horn up/down motion mechanism 25 moves the capillary tip 21 downward, whereby the fine metal wire 28 is joined to the inner lead 32 (FIG. 10). As mentioned above, because the excess length of fine metal wire 28 has already drawn back into the capillary tip 21, as shown in FIGS. 13 and 14, even when the capillary tip 21 is moving downward, the bottom dead center A of the fine metal wire 28 will not deviate from the inner lead 32. Thus, as illustrated in FIGS. 15 and 16, even when the capillary tip 21 is completely in contact with the inner lead 32, the fine metal wire 28 will not slip off the inner lead 32, nor will it bend or hang appreciably.

The second clamper 26 is opened after the fine metal wire 28 has been joined to the inner lead 32 as described above. Then, while the first clamper 23 continues to clamp the fine metal wire 28, the first clamper 23 and the capillary tip 21 are simultaneously moved upward to cut the fine metal wire 28. For the next cycle of the bonding process, the tip of the fine metal wire 28 sticking out of the capillary tip 21 is formed into another ball. This completes one cycle of the bonding process.

What is claimed is:

1. A wire bonding method comprising sequentially:
   forming a ball at the tip of a fine metal wire passing through a capillary tip;
   joining the ball by pressing the ball with the capillary tip against a first electrode;
   moving the capillary tip from the first electrode toward a second electrode while the fine metal wire is paid out through the capillary tip;
   clamping the fine metal wire with a first clamp and moving the first clamp and the capillary tip closer to the second electrode;
   releasing the first clamp from the fine metal wire;
   moving the capillary tip still closer to the second electrode;
   clamping the fine metal wire and the first clamp;
   moving the first clamp away from the capillary tip, thereby drawing an excess length of the fine metal wire protruding from the end of the capillary tip back into the capillary tip;
   clamping the fine metal wire with a second clamp located farther from the capillary tip than the first clamp;
   releasing the first clamp from the fine metal wire;
   moving the capillary tip toward the second electrode and joining the fine metal wire at the end of the capillary tip to the second electrode by pressing the capillary tip against the second electrode; and
   releasing the second clamp form the fine metal wire.
2. The method of claim 1 including, after releasing the second clamp, clamping the fine metal wire with the first clamp and moving the capillary tip and the first clamp away from the second electrode to cut the fine metal wire.

* * * * *